US010476220B2

(12) United States Patent
Morinari

(10) Patent No.: US 10,476,220 B2
(45) Date of Patent: Nov. 12, 2019

(54) SOCKET FOR ELECTRICAL COMPONENT

(71) Applicant: ENPLAS CORPORATION, Kawaguchi-shi (JP)

(72) Inventor: Takashi Morinari, Kawaguchi (JP)

(73) Assignee: ENPLAS CORPORATION, Kawaguchi-shi (JP)

(*) Notice: Subject to any disclaimer, the term of this patent is extended or adjusted under 35 U.S.C. 154(b) by 0 days.

(21) Appl. No.: 16/301,411

(22) PCT Filed: May 12, 2017

(86) PCT No.: PCT/JP2017/018080
§ 371 (c)(1),
(2) Date: Nov. 13, 2018

(87) PCT Pub. No.: WO2017/195896
PCT Pub. Date: Nov. 16, 2017

(65) Prior Publication Data
US 2019/0207351 A1    Jul. 4, 2019

(30) Foreign Application Priority Data
May 13, 2016 (JP) ................................ 2016-097247

(51) Int. Cl.
*H01R 12/00* (2006.01)
*H01R 33/76* (2006.01)
(Continued)

(52) U.S. Cl.
CPC .............. *H01R 33/76* (2013.01); *G01K 1/14* (2013.01); *G01R 1/0458* (2013.01); *G01R 31/26* (2013.01);
(Continued)

(58) Field of Classification Search
CPC .... H01R 33/76; H05B 1/0233; G01R 1/0458; G01R 31/26; F21K 9/00; F21S 8/035; H01B 3/427
(Continued)

(56) References Cited

U.S. PATENT DOCUMENTS

2011/0079427 A1* 4/2011 Powale ................ H01B 3/427
174/72 A
2011/0155200 A1* 6/2011 Simka ..................... H01L 35/30
136/205
(Continued)

FOREIGN PATENT DOCUMENTS

JP        2003-065859 A    3/2003
JP        2006-090762 A    4/2006
(Continued)

OTHER PUBLICATIONS

International Preliminary Report on Patentability from PCT/JP2017/018080, dated Nov. 22, 2018, 6 pages.

*Primary Examiner* — Jean F Duverne
(74) *Attorney, Agent, or Firm* — Morgan, Lewis & Bockius LLP

(57) ABSTRACT

An IC socket includes: a heat transfer member attached to a socket body in a manner capable of contacting an electrical component and having an opening penetratingly formed at a contact surface that contacts the electrical component accommodated in the socket body; and a temperature sensor that is mounted in the opening of the heat transfer member and has a rod-like tip end portion including a thermosensitive element and extending toward the electrical component, in which the tip end portion, as well as the heat transfer member, contacts the electrical component. In the IC socket, a tubular component having an insertion hole in which an outer surface of a portion of the temperature sensor other (Continued)

than the tip end portion is fitted in a slidable manner in the axial direction of the temperature sensor, is attached to the opening.

11 Claims, 16 Drawing Sheets

(51) Int. Cl.
    *G01K 1/14*     (2006.01)
    *G01R 31/26*     (2014.01)
    *G01R 1/04*     (2006.01)
    *G01R 31/28*     (2006.01)

(52) U.S. Cl.
    CPC ...... *G01R 31/2875* (2013.01); *G01R 31/2863* (2013.01); *H01R 2201/20* (2013.01)

(58) Field of Classification Search
    USPC .......................................................... 439/65
    See application file for complete search history.

(56) References Cited

U.S. PATENT DOCUMENTS

| | | | | |
|---|---|---|---|---|
| 2014/0168985 | A1* | 6/2014 | Chien | F21S 8/035 |
| | | | | 362/253 |
| 2014/0362582 | A1* | 12/2014 | Van De Ven | F21K 9/00 |
| | | | | 362/294 |
| 2017/0215230 | A1* | 7/2017 | Parkhe | H05B 1/0233 |

FOREIGN PATENT DOCUMENTS

| | | |
|---|---|---|
| JP | 2007-525672 A | 9/2007 |
| JP | 2015-069852 A | 4/2015 |

* cited by examiner

SOCKET FOR ELECTRICAL COMPONENT

TECHNICAL FIELD

The present invention relates to a socket for an electrical component that accommodates an electrical component and is secured to a wiring board so as to electrically connect the electrical component and the wiring board, and in particular, relates to a socket for an electrical component including a temperature sensor for sensing the temperature of an electrical component.

BACKGROUND ART

As a conventional socket for an electrical component, an IC socket that accommodates, for example, an IC (integrated circuit) package as an electrical component, and electrically connects the IC package and a wiring board, to conduct an energization test under elevated temperature, is known (for example, see Patent Document 1).

In such an IC socket, a temperature controllable heat transfer member and a temperature sensor are arranged to contact an IC package, and the temperature of the heat transfer member is controlled depending on an obtained temperature of the IC package sensed by the temperature sensor, to make an actual temperature of the IC package close to a predetermined temperature, so as to achieve uniform testing conditions. In order to reduce the thermal effect exerted on the temperature sensor by the heat transfer member, a heat insulation material is interposed between the temperature sensor and the heat transfer member.

REFERENCE DOCUMENT LIST

Patent Document

Patent Document 1: JP 2007-525672 A

SUMMARY OF THE INVENTION

Problem to be Solved by the Invention

However, since such a temperature sensor may be affected by heat emitted from the heat transfer member through a solid portion included in the heat insulation material, there is a possibility that an error will occur between the temperature sensed by the temperature sensor and the actual temperature of the IC package.

Thus, in view of this problem, an object of the present invention is to provide a socket for an electrical component, which is capable of improving accuracy of sensing temperature of an electrical component by a temperature sensor.

Means for Solving the Problem

In order to solve the problem, a socket for an electrical component according to the present invention comprises:
a socket body for accommodating the electrical component;
a heat transfer member that is attached to the socket body in a manner capable of contacting the electrical component, the heat transfer member having an opening penetratingly formed at a contact surface that contacts the electrical component; and
a temperature sensor that is mounted in the opening of the heat transfer member and has a rod-like tip end portion including a thermosensitive element and extending toward the electrical component, the tip end portion, as well as the heat transfer member, contacting the electrical component,
wherein the socket includes a support structure for supporting the temperature sensor at a portion of the temperature sensor other than the tip end portion, and the tip end portion is spaced apart from the heat transfer member by an air layer in a state in which the tip end portion is in contact with the electrical component.

Effects of the Invention

According to the socket for the electrical component of the present invention, the heat transfer between the heat transfer member and the tip end portion of the temperature sensor through a solid portion decreases, so that the thermosensitive element of the tip end portion is less affected by heat emitted from the heat transfer member, resulting in improved accuracy of sensing temperature of the electrical component by the temperature sensor.

BRIEF DESCRIPTION OF THE DRAWINGS

FIGS. 16A and 16B illustrate an example of the IC package, in which FIG. 16A is a front view and FIG. 16B is a bottom view.

MODE FOR CARRYING OUT THE INVENTION

Hereinbelow, embodiments for implementing the present invention will be described in detail with reference to the accompanying drawings.

FIGS. 1 to 6 illustrate an example of a socket for an electrical component according to a first embodiment.

The socket for an electrical component is an IC socket 1 that accommodates an IC package 100, which is an electrical component, and that is secured to a wiring board 200, to electrically connect the IC package 100 and the wiring board 200, the IC socket 1 being for use in an energization test of the IC package 100 under elevated temperature, such as a burn-in test.

Figure 16A:
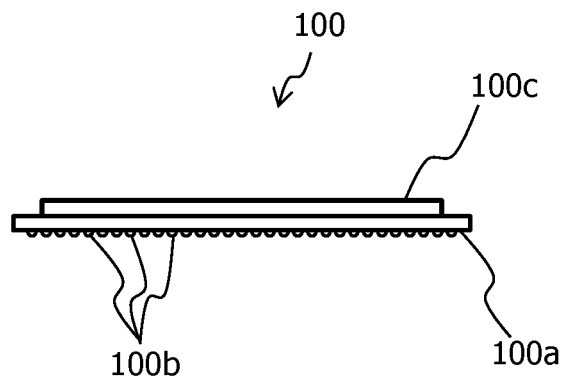
Figure 16B:
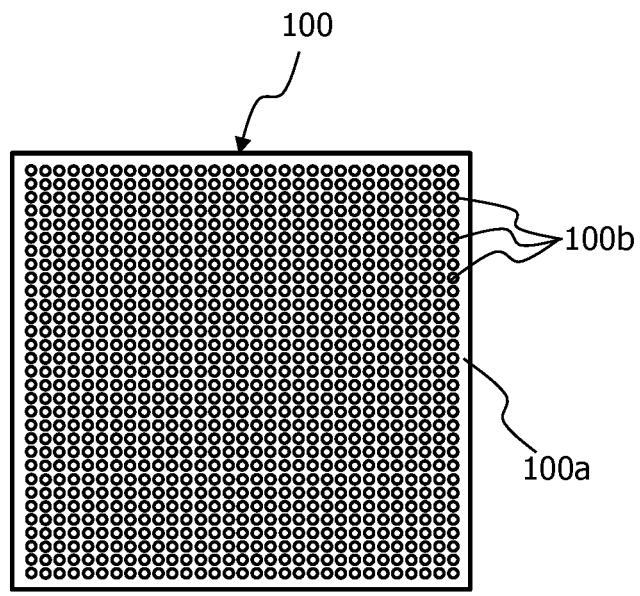

In the following description, as an example of the IC package 100 accommodated in the IC socket 1, there is employed a BGA (ball grid array)-type IC package in which a bottom face 100a of a package body formed in a substantially rectangular shape as viewed above has a plurality of hemispherical terminals 100b that are arranged in a matrix form on the bottom face 100a, and an upper face 100c of the package body is formed in a substantially planer shape, as illustrated in FIGS. 16A and 16B. However, the present invention is not limited to the BGA-type IC package, and the present invention may apply to other types of IC packages, such as an LGA (land grid array)-type IC package in which a plurality of planar electrode pads is arranged on the bottom face of the package body.

As illustrated in FIGS. 1 to 6, the IC socket 1 includes: a socket body 2 that accommodates the IC package 100 and is secured to the wiring board 200; a socket cover 3 that is rotatably attached to the socket body 2; a heat transfer member 4 for transferring heat to and from the IC package 100; and a lock mechanism 5 for fastening the socket cover 3.

The socket body 2 has a substantially rectangular parallelepiped outer shape, and when the socket body 2 is secured to the wiring substrate 200 with one face thereof facing the wiring substrate 200, the socket body 2 accommodates the IC package 100 from a face (receiving face 2a) opposite to the face facing the wiring substrate 200. The socket body 2 is provided with a first rotating shaft X1 on an end portion on one side of the receiving face 2a, and a second rotating shaft X2 on an end portion on the other side, that is opposite to the end portion on the one side, the second rotating shaft X2 being arranged substantially parallel to the first rotating shaft X1.

Furthermore, in the socket body 2, between the first rotating shaft X1 and the second rotating shaft X2, a cutout portion 2b is formed to penetrate in a direction from the receiving face 2a toward the wiring board 200. An accommodation unit 10 disposed in the cutout portion 2b accommodates the IC package 100 such that the upper surface 100c of the IC package 100 appears on the side of the receiving face 2a of the socket body 2.

Figure 7:
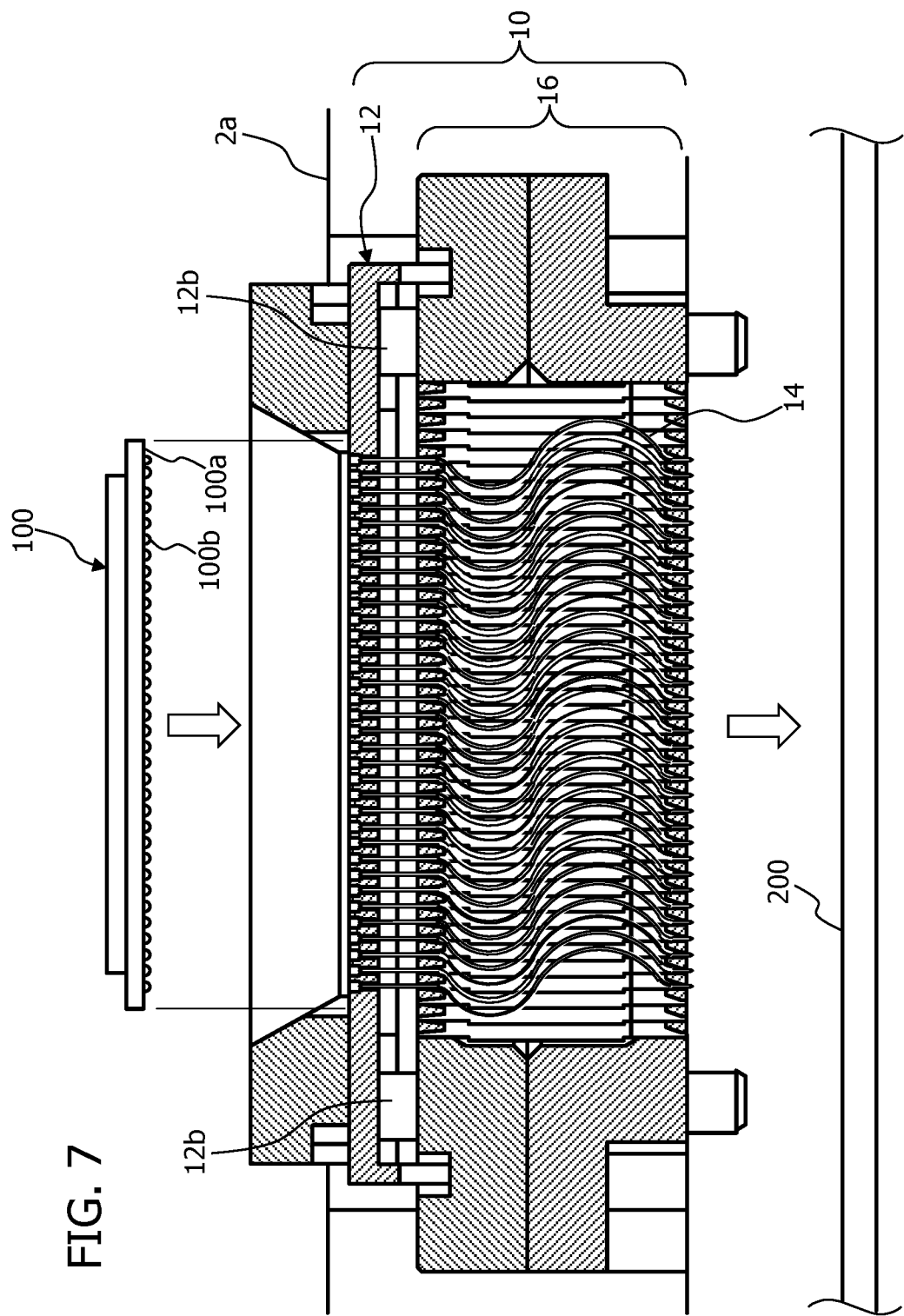
FIG. 7 is a cross-sectional view illustrating the entirety of an accommodation unit of the IC socket.
Figure 8:
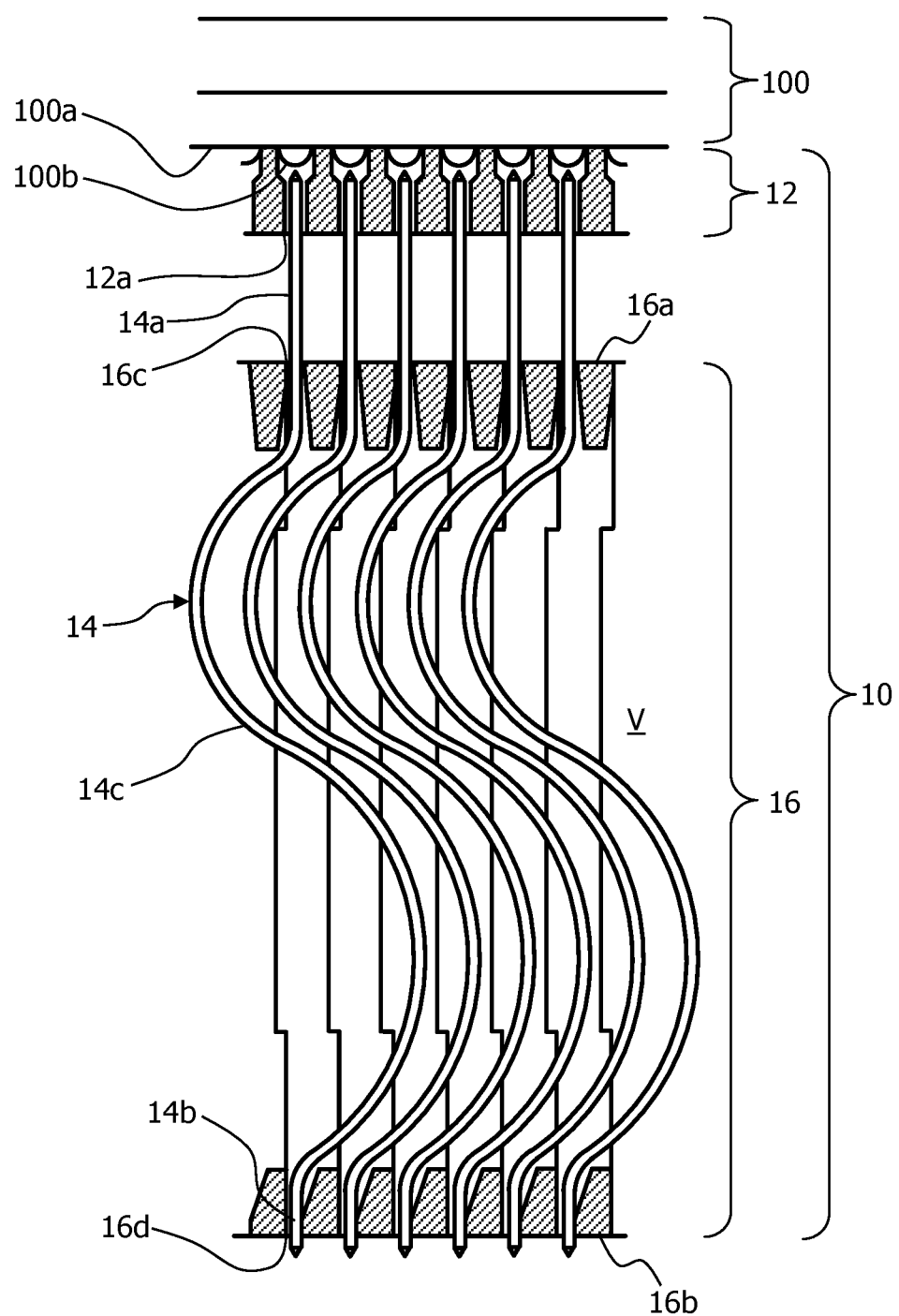
FIG. 8 is a partial cross-sectional view illustrating the details of the accommodation unit of the IC socket.

As illustrated in FIGS. 7 and 8, the accommodation unit 10 includes: a floating plate 12 that receives the IC package 100 and is movable in parallel with respect to the wiring substrate 200; and a contact pin array 16 in which a plurality of conductive contact pins 14 are arranged between the floating plate 12 and the wiring board 200, the floating plate 12 and the contact pin array 16 being disposed in this order in a direction from the receiving face 2a toward the wiring board 200.

The floating plate 12 is a plate-like electrical insulator that receives the IC package 100 such that the bottom face 100a contacts the floating plate 12. In the floating plate 12, through holes 12a are formed to extend toward the wiring board 200 at positions corresponding to the hemispherical terminals 100b. Each hemispherical terminal 100b projects into the corresponding through hole 12a.

When the floating plate 12 starts moving in parallel toward the wiring board 200, an elastic member 12b interposed between the floating plate 12 and the contact pin array 16 urges the floating plate 12 away from the wiring board 200.

A contact pin 14 includes: a first linear portion 14a the tip of which contacts a predetermined hemispheric terminal 100b of the IC package 100; a second linear portion 14b the tip of which contacts a predetermined electrode (not shown) of the wiring substrate 200; and a spring portion 14c curved, for example, in an S-shape between the first linear portion 14a and the second linear portion 14b. When the floating plate 12 is at a predetermined position, the contact pin 14 is sandwiched between the hemispherical terminal 100b of the IC package 100 and the predetermined electrode of the wiring board 200, and is subjected to compressive force, whereby the first linear portion 14a and the second linear portion 14b approach each other, and the spring portion 14c elastically deforms. Then, the contact pin 14 electrically connects the IC package 100 and the wiring board 200 while generating contact pressures in a predetermined range between the first linear portion 14a and the hemispheric terminal 100b of the IC package 100, and between the second linear portion 14b and the predetermined electrode of the wiring substrate 200, due to the restoring force against the elastic deformation of the spring portion 14c.

The size and shape of the contact pin 14 is set such that the first linear portion 14a does not contact the hemispheric terminal 100b of the IC package 100 in a state in which no compressive force acts on the elastic member 12b interposed between the floating plate 12 and the contact pin array 16.

The contact pin array 16 is made of an electrically insulating material and includes a first opposed face 16a facing the floating plate 12 and a second opposed face 16b facing the wiring substrate 200. The first opposed face 16a has a first insertion hole 16c through which the first linear portion 14a is inserted, and the opposed face 16b has a second insertion hole 16d through which the second linear portion 14b is inserted. The spring portion 14c is positioned in a space V provided between the first opposed face 16a and the second opposed face 16b. The first insertion hole 16c positions the first linear portion 14a such that the first linear portion 14a contacts the predetermined hemispherical terminal 100b of the IC package 100 through the through hole 12a. The second insertion hole 16d positions the second linear portion 14b such that the second linear portion 14b contacts the predetermined electrode of the wiring substrate 200. When the contact pin 14 is sandwiched between the hemispherical terminal 100b of the IC package 100 and the predetermined electrode of the wiring board 200 and is subjected to compressive force, the first linear portion 14a slides in the first insertion hole 16c while being supported by the first insertion hole 16c, and the second linear portion 14b slides in the second insertion hole 16d while being supported by the second insertion hole 16d.

Referring back to FIGS. 1 to 6, the socket cover 3 has a base end portion 3a that is axially supported by the first rotating shaft X1 of the socket body 2. A tip end portion 3b extending from the base end portion 3a is configured to be engaged with a latch member (described below) attached to the socket body 2, when the socket cover 3 in a state in which the socket cover 3 is open (hereinafter referred to as "open state") is rotated around the first rotating shaft X1 so that the socket cover 3 tilts toward the socket body 2 (the second rotating shaft X2), that is, when the socket cover 3 is closed (hereinafter referred to as "closed state").

When the socket cover 3 is closed, the socket cover 3 is urged in the direction opposite to the closing direction, that is, in the opening direction, by a configuration in which, for example, a torsion spring 3c fitted on the first rotating shaft X1 has one end portion engaged with the socket cover 3 and the other end portion engaged with the socket body 2.

Furthermore, the socket cover 3 includes a frame structure 3d for attaching the heat transfer member 4 between the base end portion 3a and the tip end portion 3b. The frame structure 3d is provided with a third rotating shaft X3 substantially parallel to the first rotating shaft X1.

The heat transfer member 4 is attached to the socket cover 3 by being axially supported by the third rotating shaft X3 in a rotatable manner, and has a heat transfer surface (contact surface) 4a that faces the upper face 100c of the IC package 100 when the socket cover 3 is closed. Since the heat transfer member 4 is rotatably attached to the socket cover 3, the heat transfer surface 4a contacts in parallel the upper surface 100c of the IC package 100.

In addition, since the heat transfer member 4 includes a heater (not shown) capable of output control by an external control unit and radiation fins 4b on the outer surface, the temperature of the heat transfer member 4 can be controlled, and the heat transfer member 4 transfers heat from and to the IC package 100 through the heat transfer surface 4a when the heat transfer surface 4a is brought into contact with the upper face 100c of the IC package 100. The drive circuit of the heater may be provided in the external control unit or the IC socket 1, or in any other component.

The locking mechanism 5 includes a lever member 5a axially supported by the second rotating shaft X2 in a rotatable manner, and a latch member 5b attached to an end portion on the other end side of the socket body 2 so as to be engaged with the tip end portion 3b of the socket cover 3 when the socket cover 3 is closed, the latch member 5b being configured such that when the lever member 5a is rotated around the second rotating shaft X2, the latch member 5b is made to move in a direction toward the socket body 2 via a cam mechanism (not shown).

When the lever member 5a is rotated in a state in which the socket cover 3 is engaged with the latch member 5b (closed state), the latch member 5b moves toward the socket body 2, whereby the socket cover 3 is slightly rotated and thus the heat transfer member 4 further moves toward the socket body 2. The lock mechanism 5 is configured such that the heat transfer member 4 presses the upper face 100c of the IC package 100 by the movement of the heat transfer member 4 caused by the movement of the latch member 5b, so as to move the floating plate 12 to a predetermined position. In addition, the lock mechanism 5 is configured such that, when the heat transfer member 4 presses the upper face 100c of the IC package 100 to move the floating plate 12 to the predetermined position, the lock mechanism 5 forms a locked state in which the movement of the lever member 5a is restricted and the socket cover 3 is fastened. That is, the lock mechanism 5 can change the simple closed state of the socket cover 3 to the locked state.

Figure 9:
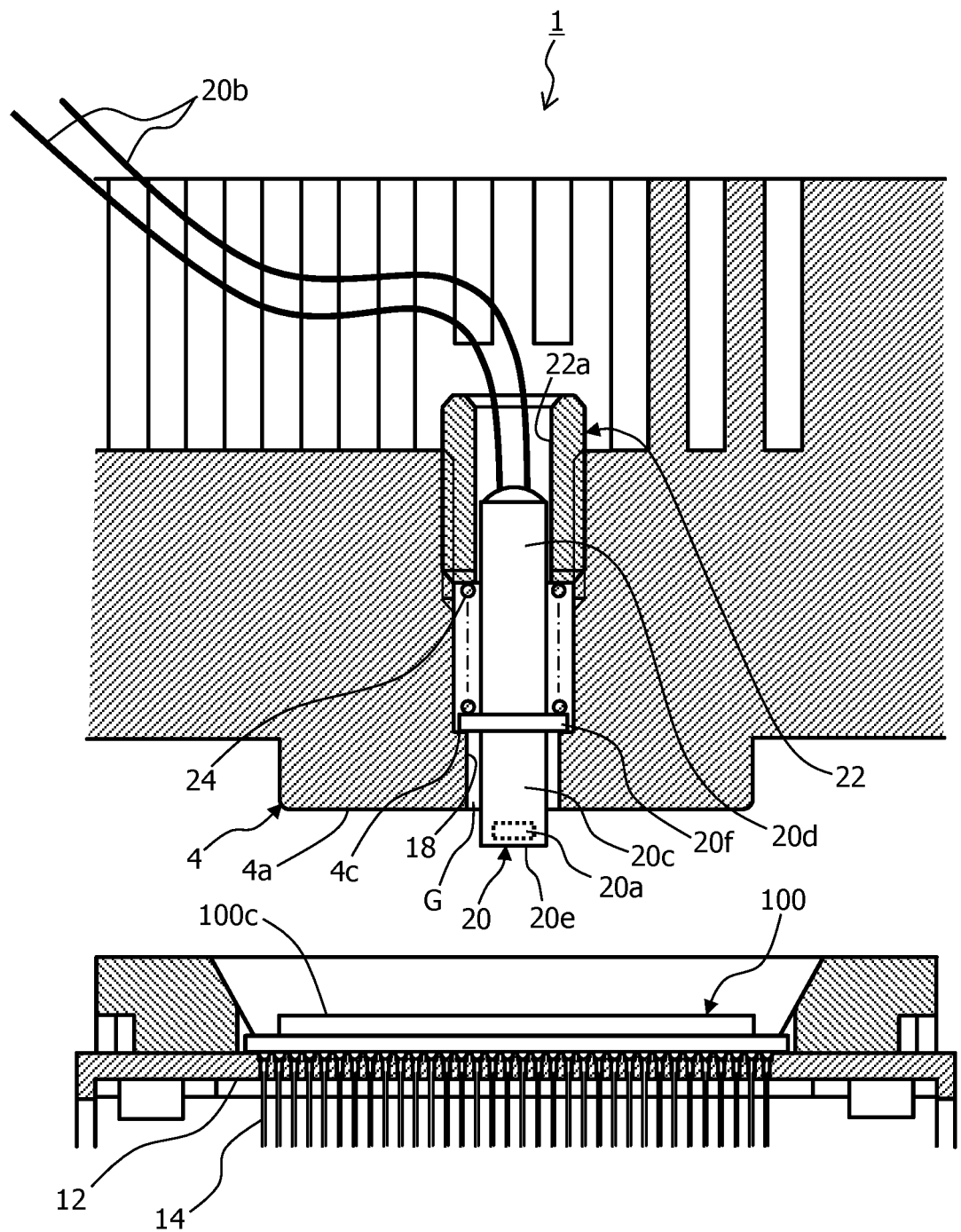
FIG. 9 is a partial cross-sectional view illustrating an arrangement and a structure of a temperature sensor in the IC socket.

Referring to FIG. 9 in particular, in addition to FIGS. 1 and 4 to 6, at the heat transfer surface 4a of the heat transfer member 4, an opening 18 that penetrates in a facing direction in which the heat transfer surface 4a and the upper face 100c of the IC package 100 face each other in the closed state, is formed. A temperature sensor 20 for sensing the temperature of the IC package 100 is disposed inside the opening 18.

The temperature sensor 20 includes a thermosensitive element 20a for detecting temperature, and an electric conductor 20b connected to the thermosensitive element 20a. The temperature sensor 20 is configured such that the thermosensitive element 20a is built in and secured to a tip end portion 20c of a linearly extending rod-like body and such that the electric conductor 20b passes through the interior of the rod-like body and is led out from a rear end portion 20d. Examples of the temperature sensor 20 can include various temperature sensing means, such as a resistance temperature sensor utilizing the temperature dependence of the electric resistance of metal, a thermocouple using the Seebeck effect, or a thermistor. The thermosensitive element 20a of the temperature sensor 20 may be exposed at a tip end face 20e of the rod-like body as long as there is no problem in sensing the temperature of the IC package 100. In addition, the rod-like body may be made of any material, such as metal, nonmetal, or resin. Furthermore, the rod-like body is a concept including both a solid body such as a cylinder, a prism column, or the like, and a hollow body (tubular body) such as a cylinder, a rectangular tube, or the like.

Inside the opening 18 of the heat transfer member 4, the temperature sensor 20 is arranged in a manner such that the tip end portion 20c is directed toward the IC package 100 and the rear end portion 20d is directed in the opposite direction so that the tip end face 20e contacts the upper face 100c of the IC package 100. In other words, the temperature sensor 20 is mounted in the opening 18 of the heat transfer member 4 so that the axial direction of the temperature sensor 20 is aligned with the facing direction of the heat transfer surface 4a and the upper face 100c.

In the heat transfer member 4, the size of the opening 18 is set such that, in a state in which the temperature sensor 20 is mounted in the opening 18, a clearance is formed between the outer surface of the temperature sensor 20 and the inner surface of the opening 18 in a direction orthogonal to the axial direction of the temperature sensor 20. In particular, the heat transfer member 4 is formed such that the inner surface of the opening 18 is spaced apart from the outer surface of the tip end portion 20c of the temperature sensor 20.

Furthermore, the heat transfer member 4 has a support structure for supporting the temperature sensor 20 at a portion of the temperature sensor 20 other than the tip end portion 20c. In this embodiment, the support structure is a fit structure F in which the outer surface of a portion of the temperature sensor 20 other than the tip end portion 20c (for example, the rear end portion 20d) is fitted in a slidable manner in the axial direction of the temperature sensor 20, and is constituted by a tubular component 22 separated from the heat transfer member 4.

The tubular component 22 has an insertion hole 22a extending in the axial direction, in which a portion of the temperature sensor 20 other than the tip end portion 20c is fitted, and through which the electric conductor 20b of the temperature sensor 20 is inserted. The tubular component 22 is attached in the opening 18 by inserting the tubular component 22 from the opposite side to the heat transfer surface 4a of the heat transfer member 4 with the axial direction of the tubular component 22 aligned with that of the temperature sensor 20 by threadedly engaging the circular outer periphery of the tubular component 22 with the circular inner periphery of the opening 18, for example. The size, shape and position of the insertion hole 22a are set such that the outer surface of the portion of the temperature sensor 20 other than the tip end portion 20c is fitted in the insertion hole 22a in a slidable manner in the axial direction of the temperature sensor 20 while the outer surface of the temperature sensor 20 is spaced apart from the inner surface of the opening 18. This makes the tubular component 22 support the temperature sensor 20 such that movement of the temperature sensor 20 in the axial direction is allowed while preventing the tip end portion 20c of the temperature sensor 20 from swaying and contacting the inner surface of the opening 18.

It is preferable that the tubular component 22 is a heat insulation component constituted by a heat insulation material so as to block the heat transfer between the heat transfer member 4 and the portion of the temperature sensor 20 other than the tip end portion 20c as much as possible.

Figure 10:
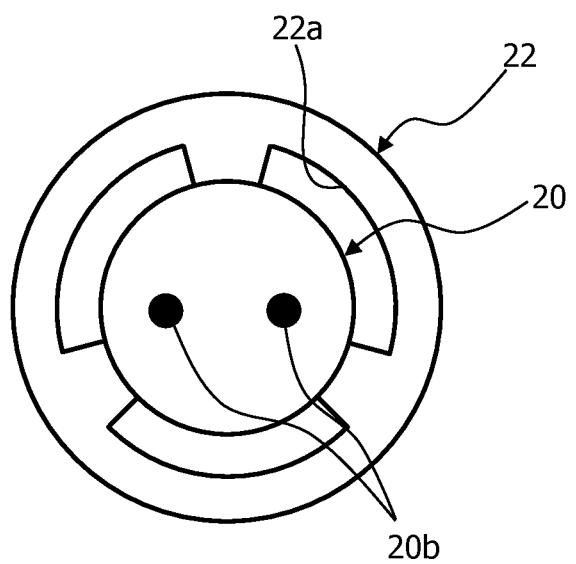
FIG. 10 is a partial plan view illustrating an example of a fit structure of the temperature sensor in the IC socket.

Furthermore, as illustrated in FIG. 10, the inner surface of the insertion hole 22a which slides on the outer surface of the portion of the temperature sensor 20 other than the tip end portion 20c may be partially recessed outwardly so as to reduce a contact area of the portion of the temperature sensor 20 other than the tip end portion 20c and the tubular component 22 to reduce the heat transfer between the temperature sensor 20 and the heat transfer member 4.

The temperature sensor 20 has, for example, a flange-like protruding portion 20f formed to protrude from the outer surface of the temperature sensor 20 at a portion other than the tip end portion 20c and the sliding portion sliding on the inner surface of the insertion hole 22a of the tubular component 22. In addition, at the inner surface of the opening 18 in a region from the tubular component 22 to the heat transfer surface 4a, the heat transfer member 4 has a step 4c for anchoring the protruding portion 20f to restrict movement of the protruding portion 20f when the temperature sensor 20 moves toward the IC package 100. The step 4c is a step structure D for preventing the temperature sensor 20 from falling out of the opening 18.

The sizes and shapes of the inner surface of the opening 18 and the protruding portion 20f are set such that the inner surface of the opening 18 and the protruding portion 20f do not contact any portion except for the step 4c in order to block the heat transfer between the temperature sensor 20 and the heat transfer member 4 as much as possible.

A spring 24 is fitted on the temperature sensor 20 between the protruding portion 20f of the temperature sensor 20 and the tubular component 22. This spring 24 is configured such that when the tip end portion 20c of the temperature sensor 20 (tip end face 20e) comes into contact with the upper face 100c of the IC package 100, one end of the spring 24 that contacts the end face of the protruding portion 20f on the side of the tubular component 22 is compressed toward the other end of the spring 24 that contacts the end face of the tubular component 22 on the side of the protruding portion 20f, to urge the protruding portion 20f toward the IC package 100 due to the restoring force caused by the elastic deformation.

It is to be noted that the spring 24 is not limited thereto, and a various elastic bodies such as rubber may be employed as long as they do not contact the inner surface of the opening 18 of the heat transfer member 4 by elastic deformation when they are interposed between the protruding portion 20f of the temperature sensor 20 and the tubular component 22 and they urge the protruding portion 20f toward the IC package 100 in a state in which the tip end portion 20c of the temperature sensor 20 is in contact with the IC package 100. Furthermore, the spring 24 is not limited to a metal, and a nonmetal or a resin material having a relatively low heat transfer coefficient may also be used.

Next, a method of using the IC socket 1 will be described.

Figure 11:
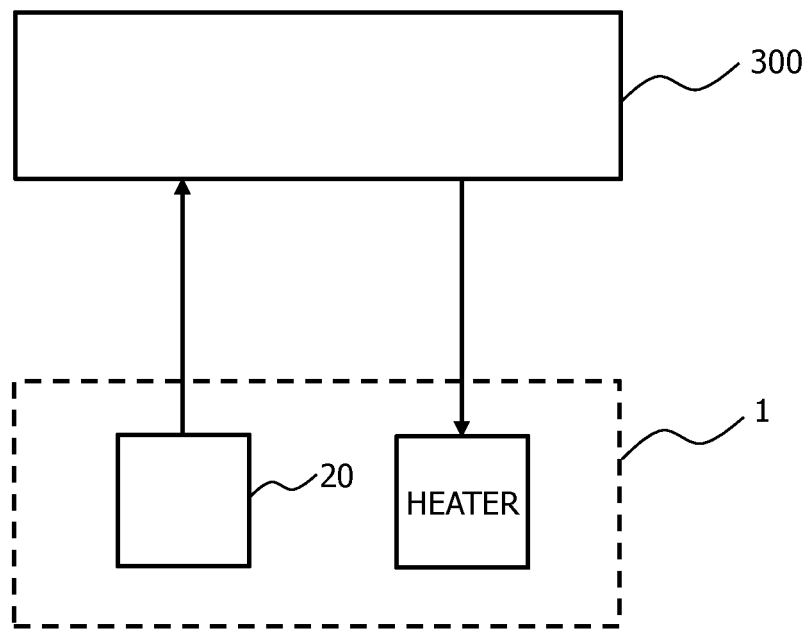
FIG. 11 is a block diagram of temperature control in an energization test of the IC socket.

An energization test, such as a burn-in test, of the IC package 100 under elevated temperature is conducted in a state in which the IC socket 1 accommodates the IC package 100 and is secured to the wiring board 200, whereby the IC package 100 and the wiring board 200 are electrically connected to each other. As illustrated in FIG. 11, the IC socket 1 is electrically connected to an external control unit 300 in such an energization test. The external control unit 300 is configured to receive an output signal of the temperature sensor 20 and to output an instruction signal to the drive circuit of the heater included in the heat transfer member 4.

Figure 1:
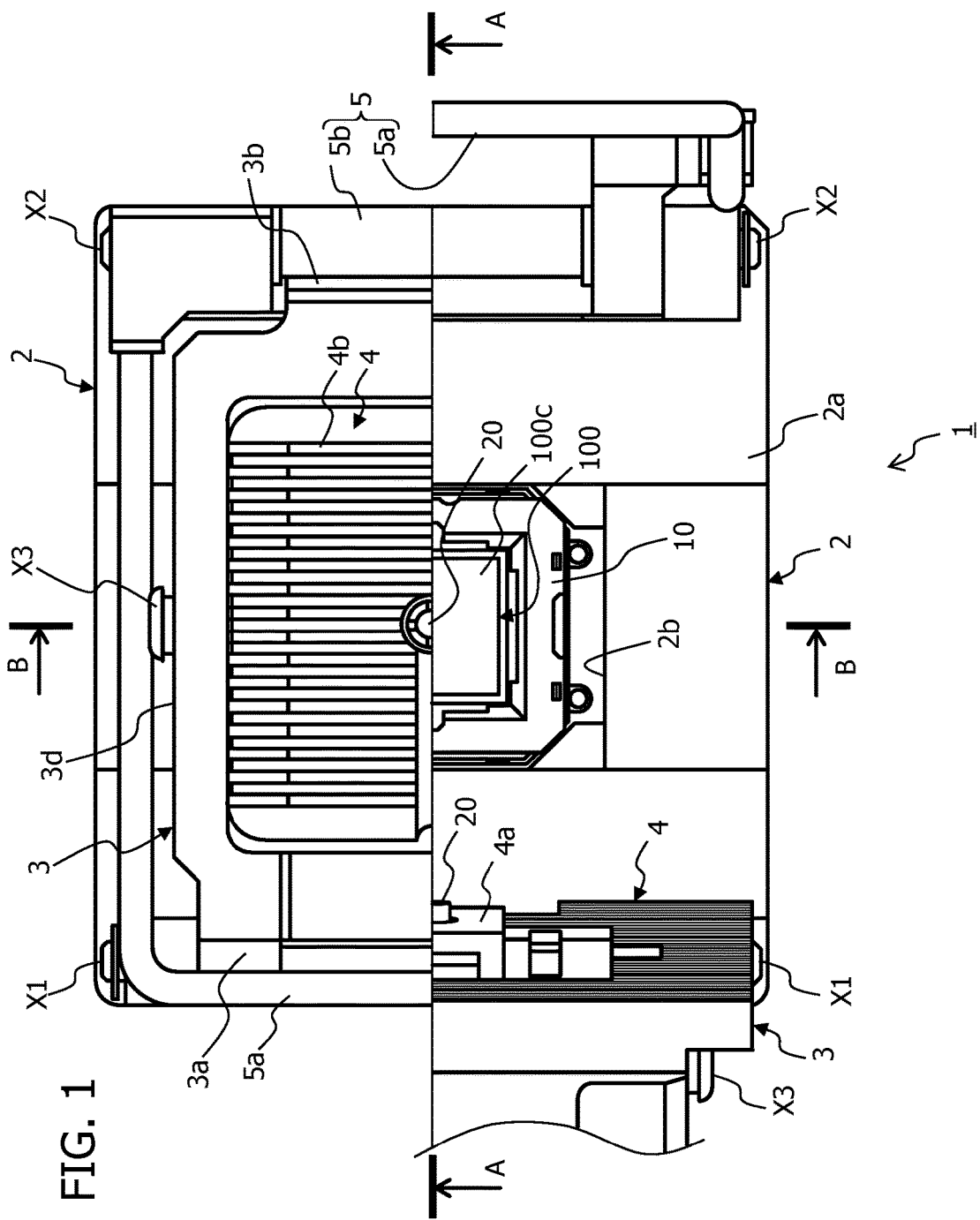
FIG. 1 is a plan view of an example of an IC socket according to a first embodiment of the present invention, partially illustrating an open state of a socket cover.
Figure 2:
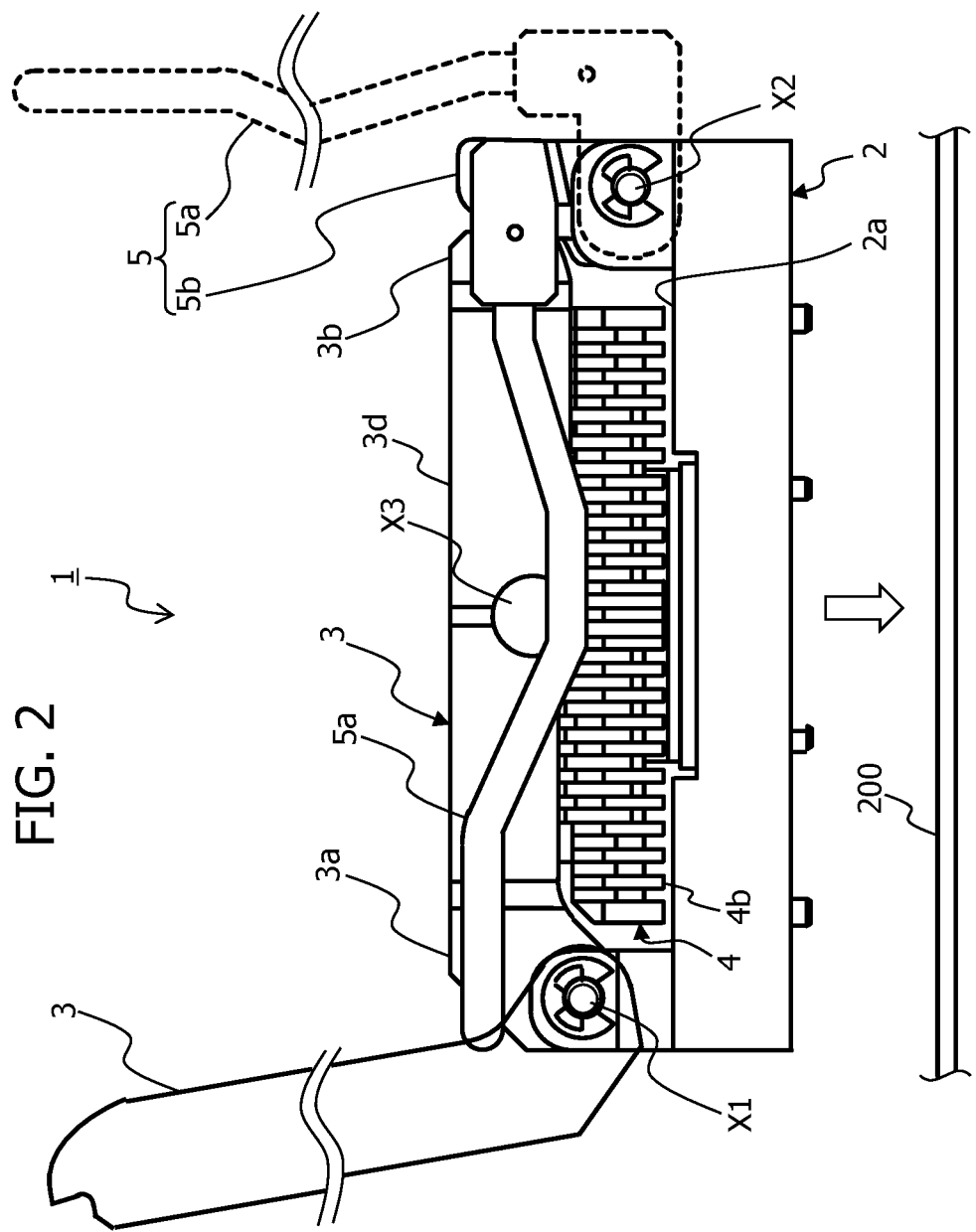
FIG. 2 is a front view of the IC socket.
Figure 3:
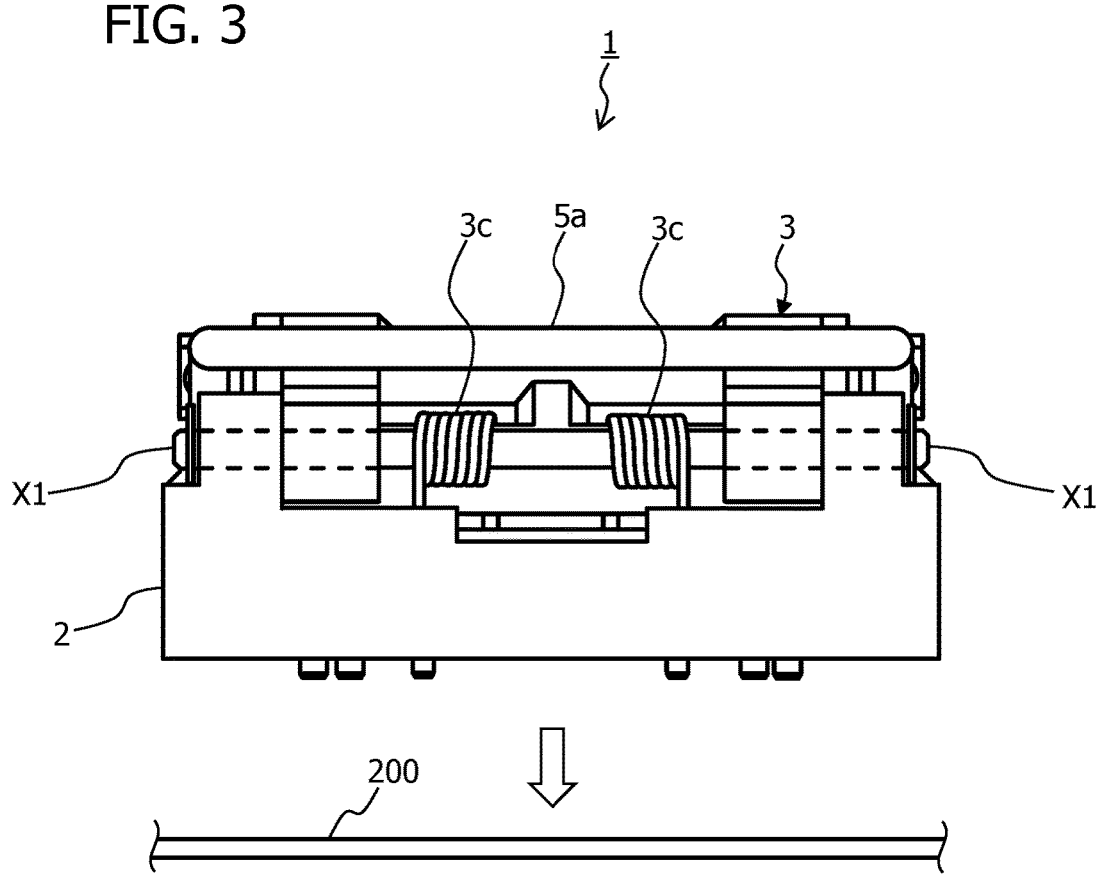
FIG. 3 is a side view of the IC socket.
Figure 4:
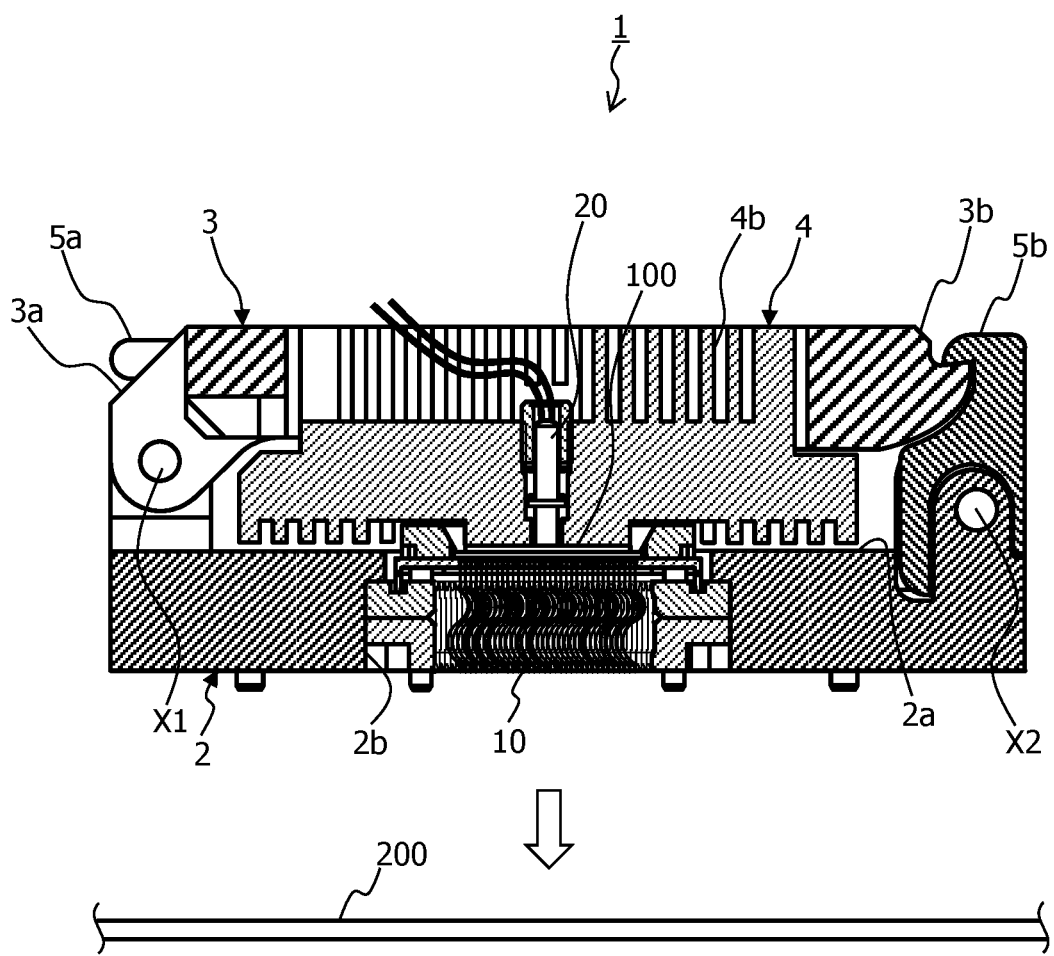
FIG. 4 is a cross-sectional view regarding the IC socket taken along line A-A of FIG. 1.
Figure 5:
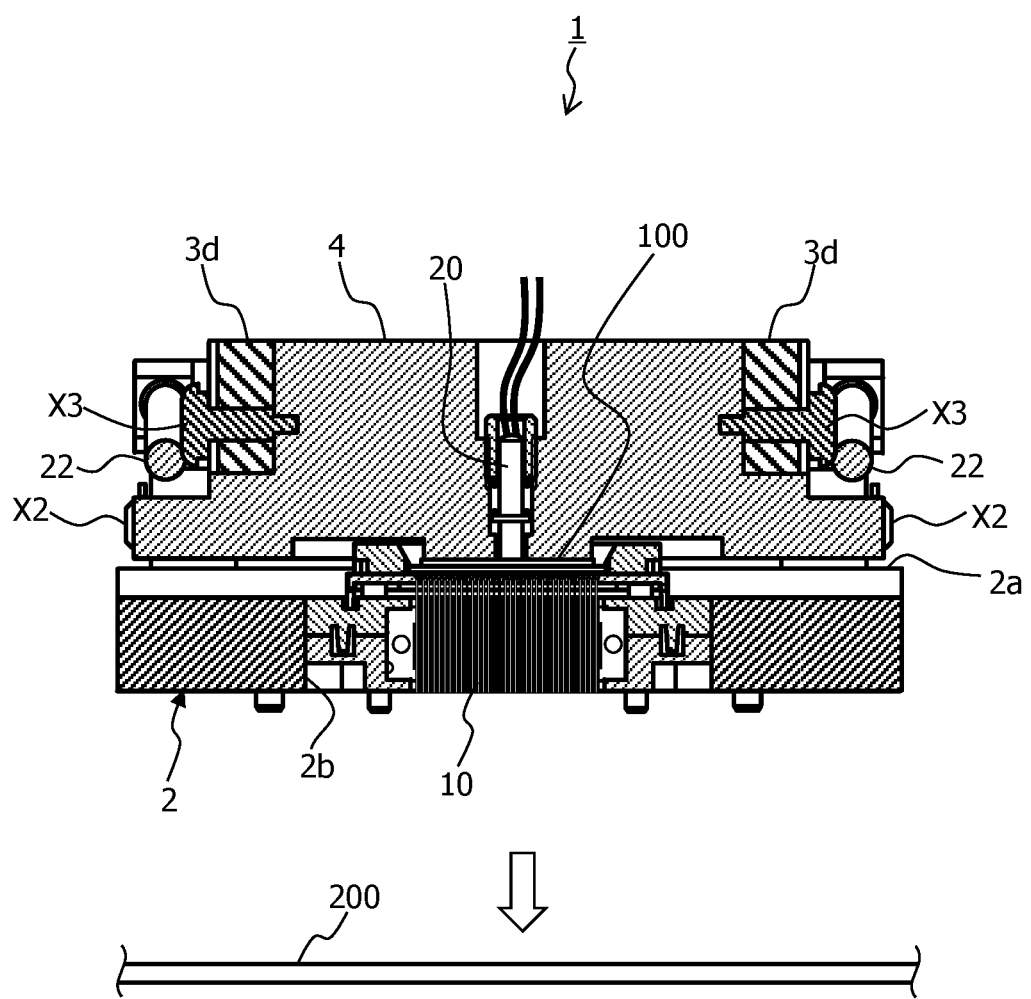
FIG. 5 is a cross-sectional view regarding the IC socket taken along line B-B of FIG. 1.

With the socket cover 3 and the lever member 5a of the IC socket 1 opened as illustrated in the half of FIG. 1 in which the IC package 100 appears, and as illustrated by the broken lines in FIG. 2, the IC package 100 is received on the floating plate 12 of the accommodation unit 10 such that the bottom face 100a contacts the floating plate 12 (see FIGS. 7 and 8).

Referring to FIG. 9, mounting the temperature sensor 20 in the opening 18 of the heat transfer member 4 is performed as follows. That is, with the spring 24 fitted on the temperature sensor 20 from the rear end portion 20d toward the protruding portion 20f, the temperature sensor 20 is inserted into the opening 18 from the tip end portion 20c, from the opposite side to the heat transfer surface 4a of the heat transfer member 4. Then, with the electric conductor 20b of the temperature sensor 20 inserted through the insertion hole 22a of the tubular component 22 and with the rear end portion 20d of the temperature sensor 20 fitted in the insertion hole 22a, the tubular member 22 is attached to the inside of the opening 18. By doing this, the temperature sensor 20 is mounted in the opening 18 of the heat transfer member 4. By anchoring the protruding portion 20f of the temperature sensor 20 at the step 4c of the step structure D when inserting the temperature sensor 20 into the opening 18, the temperature sensor 20 is prevented from falling out of the opening 18 from the heat transfer surface 4a side. When the temperature sensor 20 is mounted in the opening 18 of the heat transfer member 4, the protruding portion 20f of the temperature sensor 20 is pressed against the step 4c of the step structure D by the urging force of the spring 24 in a state in which the socket cover 3 is open, so that the tip end portion 20c of the temperature sensor 20 projects beyond the heat transfer surface 4a.

Figure 6:
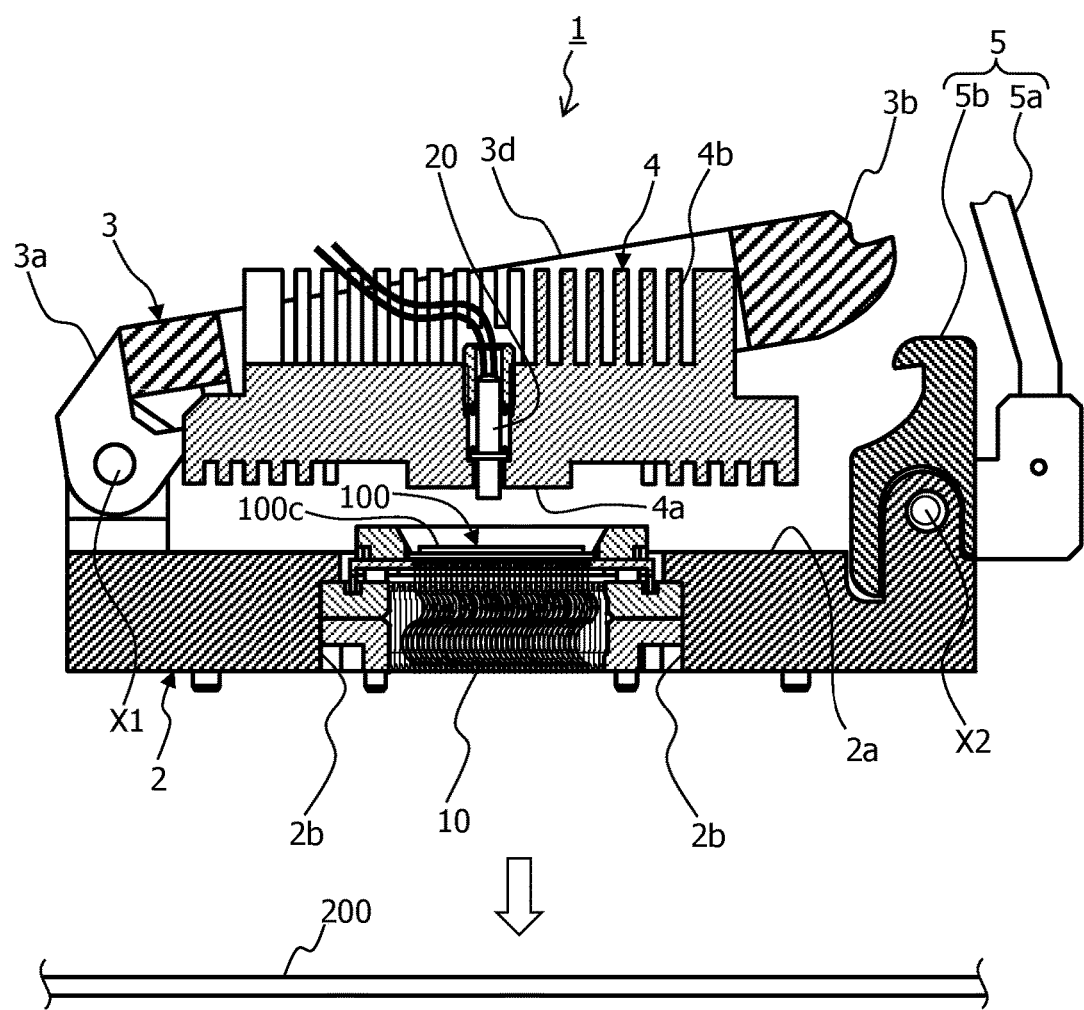
FIG. 6 is a cross-sectional view regarding the IC socket, illustrating an open state of FIG. 4.

With the IC package 100 received on the floating plate 12, the socket cover 3 is rotated around the first rotating shaft X1 and is tilted toward the socket body 2, as illustrated in FIG. 6, to make the tip end portion 3b engaged with the latch member 5b of the socket body 2, so as to bring the socket cover 3 into the closed state.

After bringing the socket cover 3 into the closed state, the lever member 5a of the lock mechanism 5 is rotated around the second rotating shaft X2 to bring the socket cover 3 into the locked state. Thus, the heat transfer member 4 presses the upper face 100c of the IC package 100 to move the floating plate 12 to the predetermined position (see FIGS. 2 and 5).

When the floating plate 12 reaches the predetermined position, the heat transfer member 4 contacts the upper face 100c of the IC package 100 in parallel, since the heat transfer member 4 is axially supported in a rotatable manner by the third rotating shaft X3 that is substantially parallel to the first rotating shaft X1. This makes it possible to decrease the bias of the pressure distribution of the pressing force applied to the IC package 100 from the heat transfer member 4, resulting in improved heat transfer efficiency between the IC package 100 and the heat transfer member 4.

When the floating plate 12 reaches the predetermined position, the contact pin 14 is sandwiched between the hemispherical terminal 100b of the IC package 100 and a predetermined electrode of the wiring board 200, and a compressive force is applied thereto, so that the spring portion 14c elastically deforms. The restoring force generated thereby generates a contact pressure in a predetermined range between the first linear portion 14a and the hemispherical terminal 100b of the IC package 100 and between the second linear portion 14b and the predetermined electrode of the wiring substrate 200. This makes the IC package 100 and the wiring substrate 200 electrically connected one another, while reducing the electrical resistance between the first linear portion 14a and the IC package 100 and between the second linear portion 14b and the wiring substrate 200 to such an extent as not to affect the test results.

Figure 12:
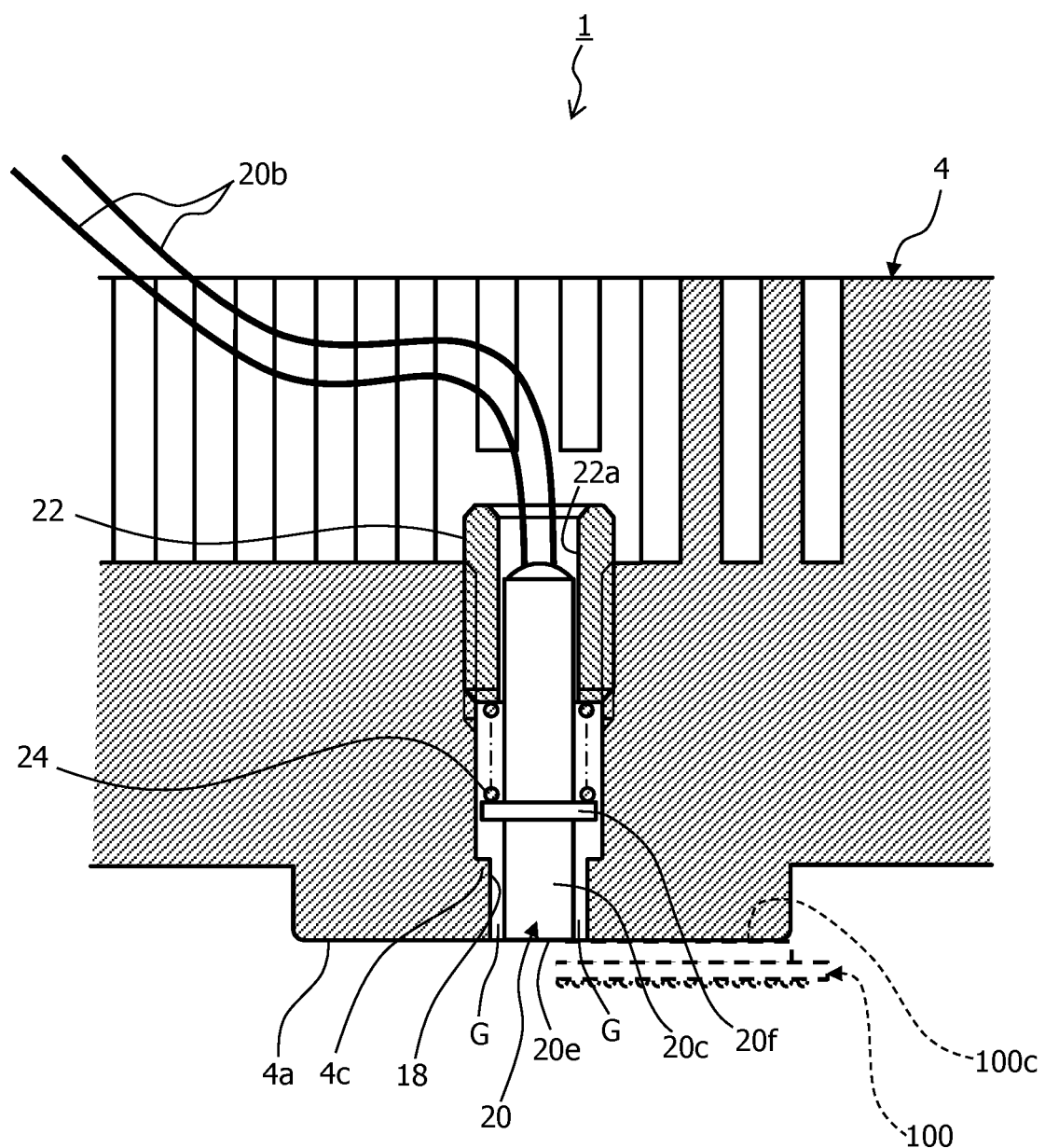
FIG. 12 is a partial cross-sectional view regarding the IC socket, illustrating a contact state of the temperature sensor and an IC package.

Furthermore, during the movement of the floating plate 12 to the predetermined position, the tip end portion 20c of the temperature sensor 20 projecting beyond the heat transfer surface 4a, as illustrated in FIG. 9, first comes into contact with the upper face 100c of the IC package 100, and the temperature sensor 20 moves backward against the elastic force of the spring 24 until the tip end face 20e of the temperature sensor 20 is flush with the heat transfer surface 4a (see FIG. 12). Because of the restoring force of the spring 24, the tip end face 20e of the temperature sensor 20 contacts the upper face 100c of the IC package 100 at an appropriate pressure, so that it becomes easy to sense a temperature close to the actual temperature of the IC package 100, resulting in improved sensing accuracy.

Furthermore, as illustrated in FIGS. 9 and 12, since the temperature sensor 20 moves while the outer surface of the portion of the temperature sensor 20 other than the tip end portion 20c slides on the inner surface of the insertion hole 22a of the tubular component 22, the axial direction of the temperature sensor 20 remains to be aligned with the facing direction in which the heat transfer surface 4a and the upper face 100c of the IC package 100 face each other in the closed state. Therefore, when the temperature sensor 20 moves backward, the tip end portion 20c hardly sways and it remains to be spaced apart from the inner surface of the opening 18, so that an air layer G is maintained between the inner surface of the opening 18 and the tip end portion 20c.

In this state, the ambient temperature of the IC socket 1 is raised to the test temperature, and energization is performed between the IC package 100 and the wiring board 200 via the IC socket 1.

Then, the external control unit 300 controls the output of the heater of the heat transfer member 4 by performing feedback control such as PID (Proportional-Integral-Differential) control, based on the obtained temperature of the IC package 100 sensed by the temperature sensor 20, so that the actual temperature of the IC package 100 approaches a predetermined temperature.

For example, when the obtained temperature of the IC package 100 sensed by the temperature sensor 20 is lower than the predetermined temperature, the external control unit 300 increases the output of the heater of the heat transfer member 4 so that the temperature of the IC package 100 increases by the heat transfer member 4 through the heat transfer surface 4a. On the other hand, when the obtained temperature of the IC package 100 sensed by the temperature sensor 20 is higher than the predetermined temperature, the external control unit reduces or turns off the output of the heater of the heat transfer member 4, and the heat transfer member 4 receives heat generated in the IC package 100 through the heat transfer surface 4a, and radiates the heat to the ambient air through the radiation fins 4b.

According to such an IC socket 1, the temperature sensor 20 is supported at the portion of the temperature sensor 20 other than the tip end portion 20c, and the tip end portion 20c of the temperature sensor 20 is spaced apart from the heat transfer member 4 by the air layer G in a state in which the tip end portion 20c of the temperature sensor 20 is in contact with the IC package 100. Thus, heat transfer due to the contact between the heat transfer member 4 and the tip end portion 20c of the temperature sensor 20 through a solid portion decreases, so that the thermosensitive element 20a of the tip end portion 20c is less affected by heat emitted from the heat transfer member 4, resulting in improved accuracy of sensing temperature of the IC package 100 by the temperature sensor 20.

Next, referring to FIG. 13, an example of a socket for an electrical component according to a second embodiment will be described. The same reference numerals are given to the configurations common to those of the first embodiment, and the explanation thereof is omitted as much as possible. This is the same in the following embodiments.

Similarly to the first embodiment, the socket for an electrical component according to the second embodiment is an IC socket 1A that accommodates the IC package 100, which is an electrical component, and that is secured to the wiring board 200, to electrically connect the IC package 100 and the wiring board 200.

The IC socket 1A is different from the IC socket 1 according to the first embodiment in that a fit structure F in which the outer surface of a portion of the temperature sensor 20 other than the tip end portion 20c (for example, the rear end portion 20d) is fitted in a slidable manner in the axial direction of the temperature sensor 20, is integrally formed with the heat transfer member 4. That is, in the IC socket 1A, an insertion hole 4d in which the portion of the temperature sensor 20 other than the tip end portion 20c is fitted and through which the electric conductor 20b of the temperature sensor 20 is inserted, is directly formed in the heat transfer member 4. For example, the insertion hole 4d is formed by inwardly projecting an inner surface of the opening 18 positioned on the opposite side to the heat transfer surface 4a. Similarly to the first embodiment, the size and shape of the insertion hole 4d are set such that the insertion hole 4d is fitted on the outer surface of the portion of the temperature sensor 20 other than the tip end portion 20c in a slidable manner in the axial direction of the temperature sensor 20, and such that the outer surface of the temperature sensor 20 is spaced apart from the inner surface of the opening 18. This makes it possible to support the temperature sensor 20, allowing the movement of the temperature sensor 20 in the axial direction while preventing the tip end portion 20c of the temperature sensor 20 from swaying and contacting the inner surface of the opening 18.

In the IC socket 1A, a step structure D for anchoring the protruding portion 20f of the temperature sensor 20 in the axial direction when the temperature sensor 20 moves inside the opening 18 toward the IC package 100, to prevent the temperature sensor 20 from falling out of the opening 18, is composed of a tubular component 26 separated from the heat transfer member 4, unlike the first embodiment.

The tubular component 26 has an insertion hole 26a extending in the axial direction, in which the temperature sensor 20 is inserted. The tubular component 26 is attached to the inner surface of the opening 18 from the side of the heat transfer surface 4a of the heat transfer member 4 with the axial direction of the tubular component 26 aligned with that of the temperature sensor 20 by threadedly engaging the circular outer periphery of the tubular component 26 with the circular inner periphery of the opening 18, for example. An end face 26b of the tubular component 26 attached to the inner surface of the opening 18, which is on the opposite side to the heat transfer surface 4a, defines the step structure D in the axial direction in the inner surface of the opening 18. This makes it possible to anchor, from the side of the insertion hole 4d, the protruding portion 20f of the temperature sensor 20 at the end face 26b of the tubular component 26 when the temperature sensor 20 moves inside the opening 18 toward the IC package 100, to prevent the temperature sensor 20 from falling out of the opening 18. It should be noted that the inner surface of the insertion hole 26a of the tubular component 26 is formed to be spaced apart from the outer surface of the temperature sensor 20.

Mounting the temperature sensor 20 in the opening 18 of the heat transfer member 4 is performed as follows. That is, with the spring 24 fitted on the temperature sensor 20 from the rear end portion 20d toward the protruding portion 20f, the temperature sensor 20 is inserted into the opening 18 from the rear end portion 20d, from the side of the heat transfer surface 4a of the heat transfer member 4, the electric conductor 20b of the temperature sensor 20 is made to pass through the insertion hole 4d of the heat transfer member 4, and the rear end portion 20d is fitted in the insertion hole 4d. Then, with the tip end portion 20c inserted in the insertion hole 26a of the tubular component 26, the tubular component 26 is attached to the inner surface of the opening 18 from the side of the heat transfer surface 4a of the heat transfer member 4. By doing this, the temperature sensor 20 is mounted in the opening 18 of the heat transfer member 4. By anchoring the protruding portion 20f of the temperature sensor 20 at the end face 26b of the tubular component 26 when attaching the tubular component 26 to the inner surface of the opening 18, the temperature sensor 18 is prevented from falling out of the opening 18.

Figure 13:
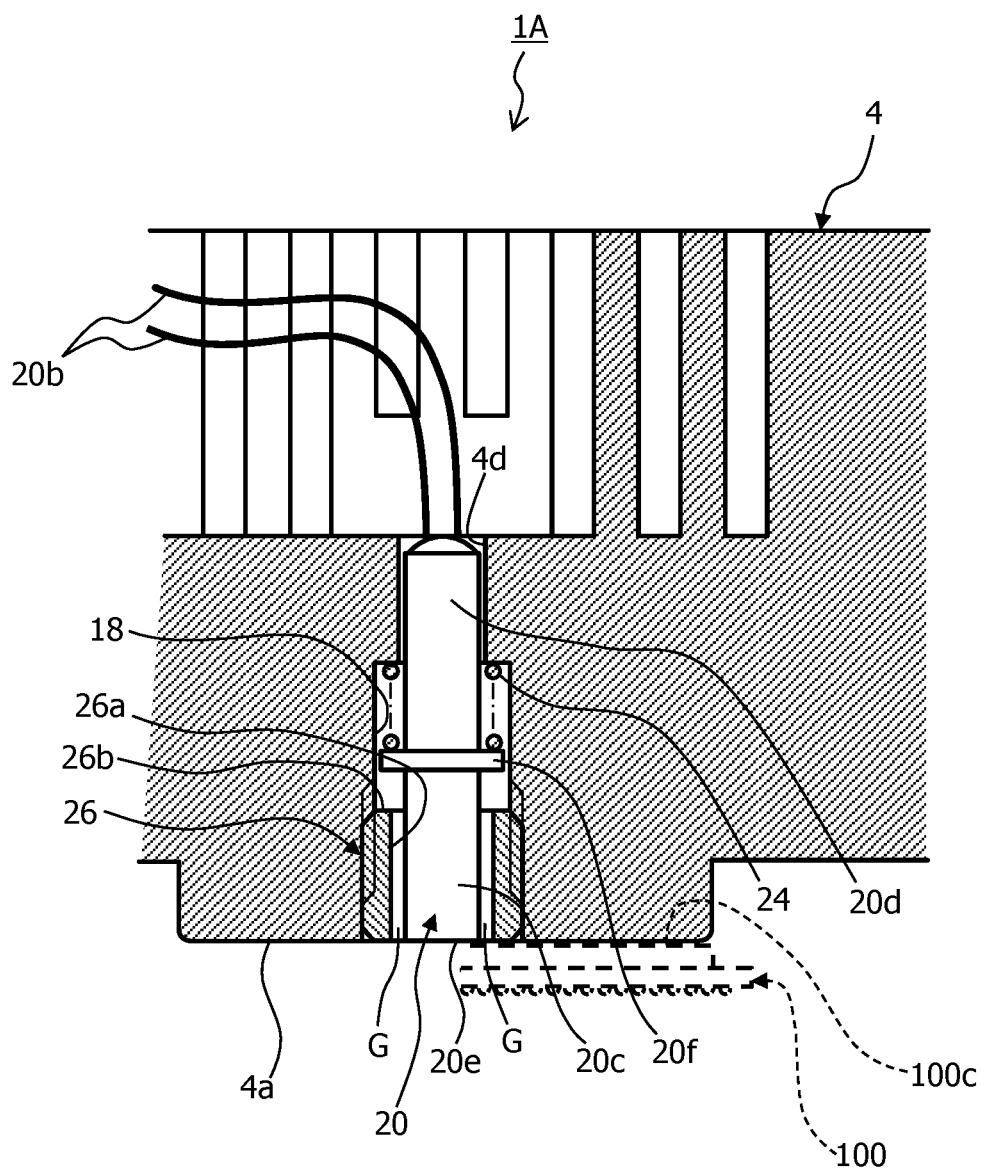
FIG. 13 is a partial cross-sectional view illustrating an example of an IC socket according to a second embodiment of the present invention.

When the floating plate 12 reaches the predetermined position, the temperature sensor 20 moves backward until the tip end face 20e is flush with the heat transfer surface 4a (state of FIG. 13). Since the outer surface of the portion of the temperature sensor 20 other than the tip end portion 20c is slidably supported on the inner surface of the insertion hole 4d of the heat transfer member 4, the axial direction of the temperature sensor 20 remains to be aligned with the facing direction in which the heat transfer surface 4a and the upper face 100c of the IC package 100 face each other in the closed state. Therefore, when the temperature sensor 20 moves backward, the tip end portion 20c hardly sways and it remains to be spaced apart from the inner surface of the insertion hole 26a of the tubular component 26, so that the air layer G is maintained between the inner surface of the insertion hole 26a and the tip end portion 20c.

According to such an IC socket 1A, the fit structure F in which the outer surface of the portion of the temperature sensor 20 other than the tip end portion 20c is fitted in a slidable manner in the axial direction of the temperature sensor 20, is integrally formed with the heat transfer member 4. Furthermore, in order to enable the temperature sensor 20 to be mounted in the opening 18, the tubular component 26 separated from the heat transfer member 4 is attached to the inner surface of the opening 18 from the side of the heat transfer surface 4a, to serve the tubular component 26 as the step structure D for preventing the temperature sensor 20 from falling out, and the inner surface of the insertion hole 26a of the tubular component 26 is formed to be spaced apart from the outer surface of the temperature sensor 20 by the air layer G. Thus, heat transfer due to the contact between the heat transfer member 4 and the tip end portion 20c of the temperature sensor 20 through a solid portion decreases, so that the thermosensitive element 20a of the tip end portion 20c is less affected by heat emitted from the heat transfer member 4, resulting in improved accuracy of sensing temperature of the IC package 100 by the temperature sensor 20.

Figure 14:
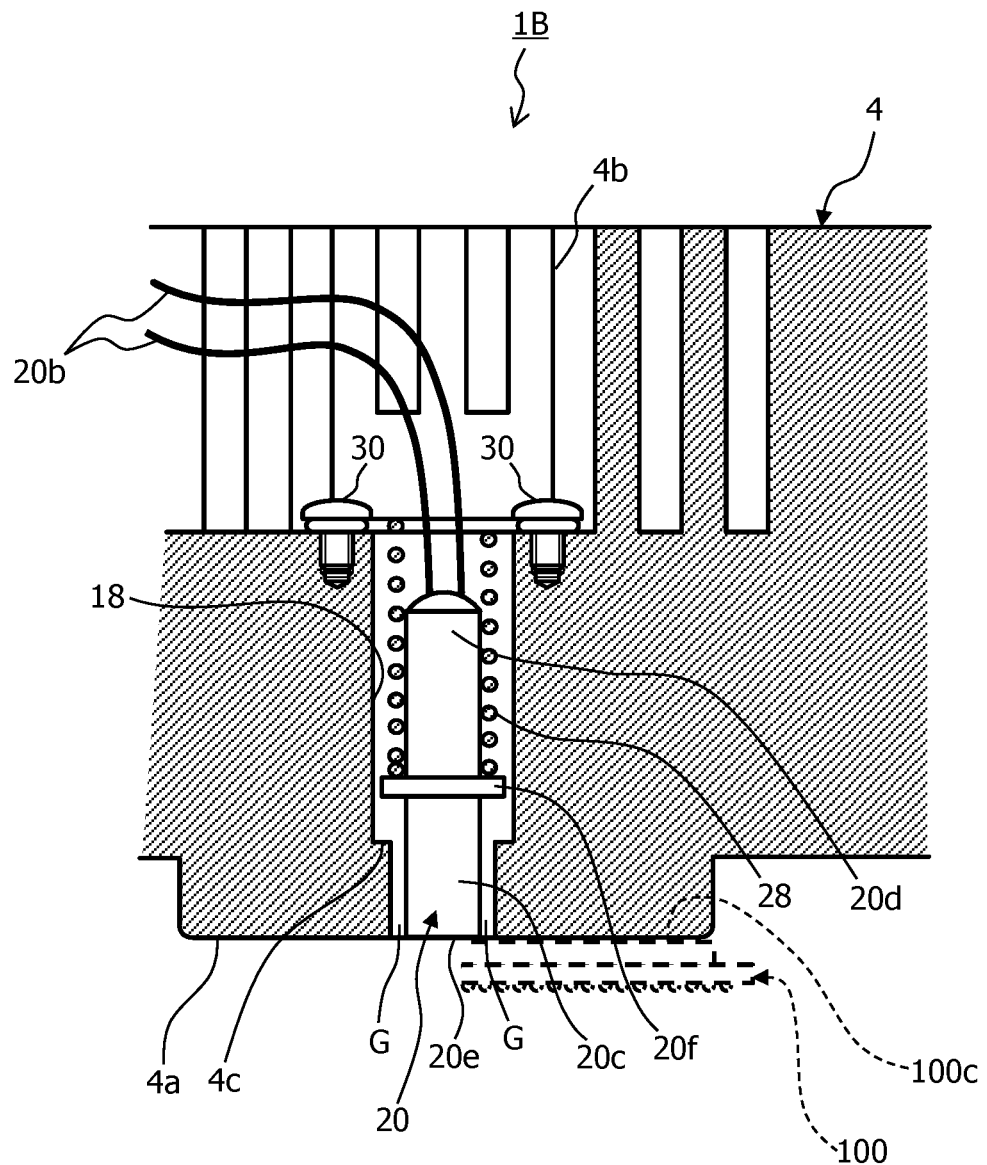
FIG. 14 is a partial cross-sectional view illustrating an example of an IC socket according to a third embodiment of the present invention.
Figure 15:
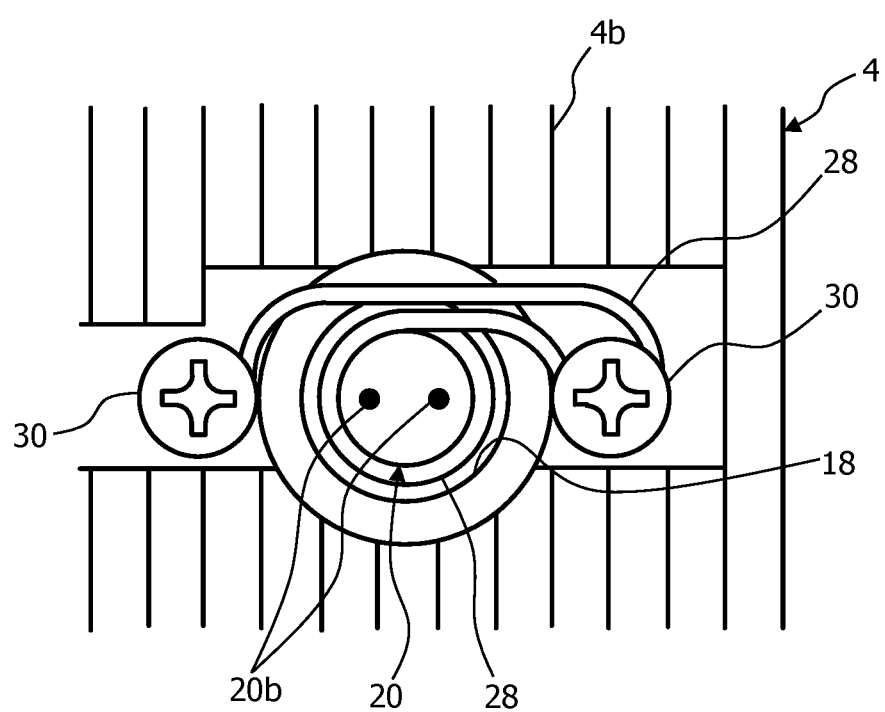
FIG. 15 is a partial plan view illustrating an example of a fastening structure of a heat insulative spring of the IC socket.

Next, referring to FIGS. 14 and 15, an example of a socket for an electrical component according to a third embodiment will be described.

Similarly to the first embodiment, the socket for an electrical component according to the third embodiment is an IC socket 1B that accommodates the IC package 100, which is an electrical component, and that is secured to the wiring board 200, to electrically connect the IC package 100 and the wiring board 200.

The IC socket 1B is different from the socket according to the first embodiment in that one heat insulative spring 28 made of resin material, for example, is employed to constitute two components of the first embodiment: the fit structure F (tubular component 22) in which the outer surface of the portion of the temperature sensor 20 other than the tip end portion 20c is fitted in a slidable manner in the axial direction of the temperature sensor 20; and the elastic body (spring 24) for urging the protruding portion 20f toward the IC package 100 in a state in which the tip end face 20e of the temperature sensor 20 is in contact with the upper face 100c of the IC package 100.

The heat insulative spring 28 extends in the opening 18 from one end fastened to the heat transfer member 4 with a fastening device 30, such as a bolt, to the other end contacting the protruding portion 20f of the temperature sensor 20 mounted in the opening 18, without contacting the inner surface of the opening 18. The heat insulative spring 28 is fitted on a portion of the temperature sensor 20 other than the tip end portion 20c, and urges the temperature sensor 20 toward the IC package 100. The size and shape of the inner peripheral surface of the heat insulative spring 28 is set such that the inner peripheral surface is fitted on the outer surface of the portion of the temperature sensor 20 other than the tip end portion 20c in a slidable manner in the axial direction of the temperature sensor 20. For example, when the temperature sensor 20 is formed in a cylindrical shape, the heat insulative spring 28 is formed in a tubular shape, and its inner diameter is set so as to be slightly greater than the outer diameter of the temperature sensor 20. This allows the temperature sensor 20 to move in the axial direction while supporting the temperature sensor 20 so that the tip end portion 20c of the temperature sensor 20 does not sway.

Mounting the temperature sensor 20 in the opening 18 of the heat transfer member 4 is performed as follows. That is, the temperature sensor 20 is inserted into the opening 18 from the tip end portion 20c, from the opposite side to the heat transfer surface 4a of the heat transfer member 4. Thereafter, the other end of the heat insulative spring 28 is made to pass the electric conductor 20b of the temperature sensor 20 with the electric conductor 20b inserted therein, to be fitted on the rear end portion 20d, and to be moved to the protruding portion 20f, and then, one end of the heat insulative spring 28 is fastened to the heat transfer member 4 (for example, the peripheral edge portion of the opening 18). By anchoring the protruding portion 20f of the temperature sensor 20 at the step 4c of the step structure D when inserting the temperature sensor 20 into the opening 18, the temperature sensor 20 is prevented from falling out of the opening 18 from the side of the heat transfer surface 4a.

When the floating plate 12 reaches the predetermined position, the temperature sensor 20 moves backward until the tip end face 20e is flush with the heat transfer surface 4a. Since the outer surface of the portion of the temperature sensor 20 other than the tip end portion 20c is slidably supported on the inner peripheral surface of the heat insulative spring 28, the axial direction of the temperature sensor 20 remains to be aligned with the facing direction in which the heat transfer surface 4a and the upper face 100c of the IC package 100 face each other in the closed state. Therefore, when the temperature sensor 20 moves backward, the tip end portion 20c hardly sways and it remains to be spaced apart from the inner surface of the opening 18, so that the air layer G is maintained between the inner surface of the opening 18 and the tip end portion 20c.

According to such an IC socket 1B, the two components of the first embodiment, that is, the fit structure F in which the outer surface of the portion of the temperature sensor 20 other than the tip end portion 20c is fitted in a slidable manner in the axial direction of the temperature sensor 20 and the elastic body for urging the protruding portion 20f toward the IC package in a state in which the tip end portion 20c of the temperature sensor 20 is in contact with the IC package 100, are achieved by one heat insulative spring 28. Similarly to the first embodiment, since the tip end portion 20c of the temperature sensor 20 is spaced apart from the heat transfer member 4 by the air layer G in a state in which the tip end portion 20c of the temperature sensor 20 is in contact with the IC package 100, heat transfer due to the contact between the heat transfer member 4 and the tip end portion 20c of the temperature sensor 20 through a solid portion decreases, so that the thermosensitive element 20a of the tip end portion 20c is less affected by heat emitted from the heat transfer member 4. Therefore, it is possible to improve the accuracy of sensing temperature of the IC package 100 by the temperature sensor 20 while reducing the number of parts of the IC socket 1.

In the first embodiment, the fit structure F is constituted by the cylindrical component 22 separated from the heat transfer member 4, and the step structure D is directly formed as the step 4c on the inner surface of the opening 18 of the heat transfer member 4. On the other hand, in the second embodiment, the fit structure F is directly formed as the insertion hole 4d in the heat transfer member 4, and the step structure D is constituted by the tubular component 22 separated from the heat transfer member 4. Instead of these combinations of the fit structure F and the step structure D, a combination of the fit structure F constituted by the tubular component 22 separated from the heat transfer member 4 and the step structure D constituted by the tubular component 26 separated from the heat conducting member 4, may be employed.

In the first and second embodiments, as the support structure for supporting the temperature sensor 20 at the portion of the temperature sensor 20 other than the tip end portion 20c, the fit structure F in which the outer surface of the portion of the temperature sensor 20 other than the tip end portion 20c is fitted in a slidable manner in the axial direction of the temperature sensor 20, is used. On the other hand, when the heat transfer surface 4a and the tip end face 20e of the temperature sensor 20 can be dimensionally controlled to be flush with each other, a structure for fixing the portion of the temperature sensor 20 other than the tip end portion 20c, such as the rear end portion 20d, to the insertion hole 22a of the tubular component 22 or the insertion hole 4d of the heat transfer member 4 may be adopted instead of the fit structure F. When the portion of the temperature sensor 20 other than the tip end portion 20c, such as the rear end portion 20 d, is fixed to the insertion hole 22a of the tubular component 22 or the insertion hole 4d of the heat transfer member 4, the spring 24, the protruding portion 20f of the temperature sensor 20 and the step structure D can be omitted.

In the first to third embodiments, the socket cover 3 is configured to rotate around the first rotating shaft X1. However, the socket cover 3 is not limited to this configuration. The socket cover 3 may have any configuration as long as the heat transfer surface 4a of the heat transfer member 4 attached to the socket cover 3 can contact in parallel the upper face 100c of the IC package 100, such as a configuration in which the socket cover 3 is attached to the socket body 2 in a manner capable of moving in parallel with respect to the receiving face 2a of the socket body 2.

In the first to third embodiments, when the temperature sensor 20 can hardly rotate around the axis inside the insertion hole 22a of the tubular component 22, the insertion hole 4d of the heat transfer member 4, or the heat insulative spring 28, because the cross section of the temperature sensor 20 is not circular, for example, the protruding portion 20f of the temperature sensor 20 may be intermittently formed around the axis instead of continuously forming around the axis on the entire circumference of the temperature sensor 20. On the other hand, the step structure D may also be intermittently formed on the inner surface of the opening 18 so that the protruding portion 20f which is intermittently formed around the axis is anchored in the axial direction when the temperature sensor 20 moves toward the IC package 100. This makes it possible to reduce heat transfer due to the contact between the temperature sensor 20 and the heat transfer member 4 through a solid portion.

In the first to third embodiments, although the IC sockets 1, 1A and 1B that accommodate the IC package 100, which is an electrical component, are illustrated as examples of the socket for an electrical component, the present invention is not limited thereto, and other electrical components may be accommodated. Instead of the contact pin 14, a probe pin may be used.

REFERENCE SYMBOL LIST 1, 1A, 1B 1C socket
2 Socket body
3 Socket cover
4 Heat transfer member
4a Heat transfer surface
4c Step
4d Insertion hole
18 Opening
20 Temperature sensor
20a Thermosensitive element
20c Tip end portion
20d Rear end portion
20e Tip end face
20f Protruding portion
22 Tubular component
22a Insertion hole
24 Spring
26 Tubular component
26a Insertion hole
26b End face
28 Heat insulative spring
100 IC package
100c Upper face

The invention claimed is:

1. A socket for an electrical component, comprising:
a socket body for accommodating the electrical component;
a heat transfer member that is attached to the socket body in a manner capable of contacting the electrical component, the heat transfer member having an opening penetratingly formed at a contact surface that contacts the electrical component; and
a temperature sensor that is mounted in the opening of the heat transfer member and has a rod-like tip end portion including a thermosensitive element and extending toward the electrical component, the tip end portion, as well as the heat transfer member, contacting the electrical component,
wherein the socket includes a support structure for supporting the temperature sensor at a portion of the temperature sensor other than the tip end portion, and the tip end portion is spaced apart from the heat transfer member by an air layer in a state in which the tip end portion is in contact with the electrical component,
wherein the support structure is a fit structure in which an outer surface of the portion of the temperature sensor other than the tip end portion is fitted in a slidable manner in an axial direction, and
wherein the fit structure is constituted by a heat insulation component separated from the heat transfer member.

2. The socket for the electrical component, according to claim 1, wherein the heat insulation component is secured so that an outer periphery of the heat insulation component is threadedly engaged with an inner periphery of the opening from an opposite side to the contact surface of the heat transfer member.

3. The socket for the electrical component, according to claim 1, wherein, on an inner surface of the opening, the heat transfer member has a step structure for anchoring, in an axial direction, a protruding portion formed to protrude from an outer surface of the temperature sensor at a portion of the temperature sensor other than the tip end portion.

4. The socket for the electrical component, according to claim 2, wherein, on an inner surface of the opening, the heat transfer member has a step structure for anchoring, in an axial direction, a protruding portion formed to protrude from an outer surface of the temperature sensor at a portion of the temperature sensor other than the tip end portion.

5. The socket for the electrical component, according to claim 3, further comprising an elastic body that is interposed between the protruding portion and the fit structure, and urges the protruding portion toward the electrical component in a state in which the tip end portion is in contact with the electrical component.

6. The socket for the electrical component, according to claim 4, further comprising an elastic body that is interposed between the protruding portion and the fit structure, and urges the protruding portion toward the electrical component in a state in which the tip end portion is in contact with the electrical component.

7. The socket for the electrical component, according to claim 1, wherein the heat insulation component is a spring that extends from one end fastened to the heat transfer member to the other end contacting a protruding portion formed to protrude in a direction orthogonal to the axial direction at a portion of the temperature sensor other than the tip end portion, that is slidably fitted on a portion of the temperature sensor other than the tip end portion, and that is capable of urging the temperature sensor toward the electrical component.

8. The socket for the electrical component, according to claim 7, wherein the spring is made of a resin material.

9. A socket for an electrical component, comprising:
a socket body for accommodating the electrical component;
a heat transfer member that is attached to the socket body in a manner capable of contacting the electrical component, the heat transfer member having an opening penetratingly formed at a contact surface that contacts the electrical component; and
a temperature sensor that is mounted in the opening of the heat transfer member and has a rod-like tip end portion including a thermosensitive element and extending toward the electrical component, the tip end portion, as well as the heat transfer member, contacting the electrical component,
wherein the socket includes a support structure for supporting the temperature sensor at a portion of the temperature sensor other than the tip end portion, and the tip end portion is spaced apart from the heat transfer member by an air layer in a state in which the tip end portion is in contact with the electrical component,
wherein the support structure is a fit structure in which an outer surface of the portion of the temperature sensor other than the tip end portion is fitted in a slidable manner in an axial direction, and
wherein the fit structure is integrally formed with the heat transfer member.

10. The socket for the electrical component, according to claim 9, wherein a step structure for anchoring a protruding portion formed to protrude from an outer surface of the temperature sensor at a portion of the temperature sensor other than the tip end portion is formed by attaching a component separated from the heat transfer member to an inner surface of the opening from the contact surface, wherein the separate component and a portion of the temperature sensor other than the protruding portion are spaced apart.

11. A socket for an electrical component, comprising:
a socket body for accommodating the electrical component;
a heat transfer member that is attached to the socket body in a manner capable of contacting the electrical component, the heat transfer member having an opening penetratingly formed at a contact surface that contacts the electrical component; and
a temperature sensor that is mounted in the opening of the heat transfer member and has a rod-like tip end portion including a thermosensitive element and extending toward the electrical component, the tip end portion, as well as the heat transfer member, contacting the electrical component,
wherein the socket includes a support structure for supporting the temperature sensor at a portion of the temperature sensor other than the tip end portion, and the tip end portion is spaced apart from the heat transfer member by an air layer in a state in which the tip end portion is in contact with the electrical component.

* * * * *